US007990767B2

(12) United States Patent
Sharon et al.

(10) Patent No.: US 7,990,767 B2
(45) Date of Patent: Aug. 2, 2011

(54) FLASH MEMORY SYSTEM HAVING CROSS-COUPLING COMPENSATION DURING READ OPERATION

(75) Inventors: Eran Sharon, Rishon Lezion (IL); Idan Alrod, Herzliya (IL)

(73) Assignee: SanDisk IL Ltd., Kfar Saba (IL)

( * ) Notice: Subject to any disclaimer, the term of this patent is extended or adjusted under 35 U.S.C. 154(b) by 64 days.

(21) Appl. No.: 12/650,270

(22) Filed: Dec. 30, 2009

(65) Prior Publication Data

US 2011/0157981 A1 Jun. 30, 2011

(51) Int. Cl.
*G11C 16/04* (2006.01)

(52) U.S. Cl. ............ 365/185.03; 365/185.23; 365/185.2

(58) Field of Classification Search ............ 365/185.03, 365/185.23, 185.2, 189.15, 189.16
See application file for complete search history.

(56) References Cited

U.S. PATENT DOCUMENTS

| 5,867,429 | A | 2/1999 | Chen et al. | |
|---|---|---|---|---|
| 6,542,412 | B2 * | 4/2003 | Ogura et al. | 365/185.33 |
| 7,751,237 | B2 * | 7/2010 | Alrod et al. | 365/185.02 |
| 2002/0145915 | A1 | 10/2002 | Ogura et al. | |
| 2004/0190092 | A1 * | 9/2004 | Silverbrook et al. | 358/539 |
| 2008/0137985 | A1 * | 6/2008 | Mokhnatyuk | 382/274 |
| 2008/0198650 | A1 | 8/2008 | Shalvi et al. | |
| 2008/0219050 | A1 | 9/2008 | Shalvi et al. | |
| 2008/0298127 | A1 | 12/2008 | Kim et al. | |
| 2009/0080259 | A1 | 3/2009 | Alrod et al. | |

FOREIGN PATENT DOCUMENTS

WO 2007/132453 A2 11/2007

OTHER PUBLICATIONS

International Search Report issued in international application No. PCT/IB2010/003338, mailed May 3, 2011 (5 pages).
International Written Opinion issued in international application No. PCT/IB2010/003338, mailed on May 3, 2011 (8 pages).

* cited by examiner

*Primary Examiner* — Gene N Auduong
(74) *Attorney, Agent, or Firm* — Brinks Hofer Gilson & Lione

(57) ABSTRACT

A method for reading an addressed cell of a memory system comprises applying at least two different voltage levels to a control gate of a memory cell in an array of memory cells, wherein the memory cell is adjacent to and in electrical field communication with the addressed memory cell. A threshold voltage of the addressed memory cell is measured at each of the at least two different applied voltage levels. At least two of the measured threshold voltages of the addressed memory cell are converted to one or more bit values stored in the addressed memory cell. The bit values are provided to a host of the memory system. An apparatus implementing the method is also disclosed.

22 Claims, 9 Drawing Sheets

FLASH MEMORY SYSTEM HAVING CROSS-COUPLING COMPENSATION DURING READ OPERATION

BACKGROUND

1. Technical Field

The present application generally relates to flash memory systems and, more particularly, to the reduction of cross-coupling effects during reading of an addressed memory cell.

2. Related Art

Flash devices may exhibit reading errors due to cross-coupling effects. Cross-coupling effects may be caused by coupling between floating gates of adjacent cells that are in electrical field communication with an addressed cell that is read. The floating-gate-to-floating-gate coupling phenomenon may occur between sets of adjacent memory cells that are programmed at different times. For example, a first memory cell may be programmed to add a level of charge to its floating gate corresponding to one or more bit values. Subsequently, one or more adjacent memory cells may be programmed to add a level of charge to their floating gates corresponding to one or more bit values. After one or more of the adjacent memory cells are programmed, the charge level read from the first memory cell may appear to be different than originally programmed due to cross-coupling effects that the charges on the adjacent memory cells have on the first memory cell. As such, cross-coupling from the adjacent memory cells can shift the apparent charge level read from the first memory cell. This shift may result in an erroneous reading of the data stored in the first memory cell.

Compensation for the cross-coupling between an addressed memory cell and one or more of its adjacent cells may be made when the state of the addressed memory cell is read. Prior methods are based on correction of the read voltage of the addressed cell (or of the estimate of its stored bits) based on the read voltage of the adjacent cells and on the expected voltage shift due to cross-coupling effects from the adjacent cells. These expected voltage shifts are based on the average cross-coupling coefficient, taken over all pairs of adjacent and addressed cell having the same relative location. The problem with this approach is that due to variations in the fabrication process of the flash array, there exist variations in the cross-coupling coefficients between different pairs. These variations result in reduced accuracy of such cross-coupling compensation techniques, which are based on the average value. Variance of these irregularities may increase as manufacturing processes reduce the size of flash memory devices.

SUMMARY

A method for reading an addressed cell of a memory die in a memory system comprises applying at least two different voltage levels to a control gate of a memory cell in an array of memory cells, wherein the memory cell is adjacent to and in electrical field communication with the addressed memory cell. A threshold voltage of the addressed memory cell is measured at each of the at least two different applied voltage levels. At least two of the measured threshold voltages of the addressed memory cell are converted to one or more bit values stored in the addressed memory cell, wherein the converting of the at least two measured voltages is done outside the memory die. The bit values are provided to a host of the memory system. An apparatus carrying out the method is also disclosed.

According to another aspect, a method is disclosed for reading an addressed memory cell in a memory die of a memory system. The method includes determining a reference voltage difference for a plurality of target memory cells of an array of memory cells. At least two different voltage levels are applied to a control gate of an adjacent memory cell that is in electrical field communication with the addressed memory cell. A threshold voltage of the addressed memory cell is measured at each of the at least two different applied voltage levels. The method further includes calculating a specific voltage difference between threshold voltages of the addressed memory cell measured at two of the different voltage levels applied to the adjacent memory cell. At least one of the measured threshold voltages of the addressed memory cell are converted to one or more bit values using the specific voltage difference, where the converting depends on a difference between the specific voltage difference and the reference voltage difference. The one or more bit values are provided to a host system of the memory system.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The components in the figures are not necessarily to scale, emphasis instead being placed upon illustrating the principles of the invention. Moreover, in the figures, reference numerals having the same values designate corresponding parts throughout the different views.

DETAILED DESCRIPTION OF THE PREFERRED EMBODIMENTS

Figure 1:
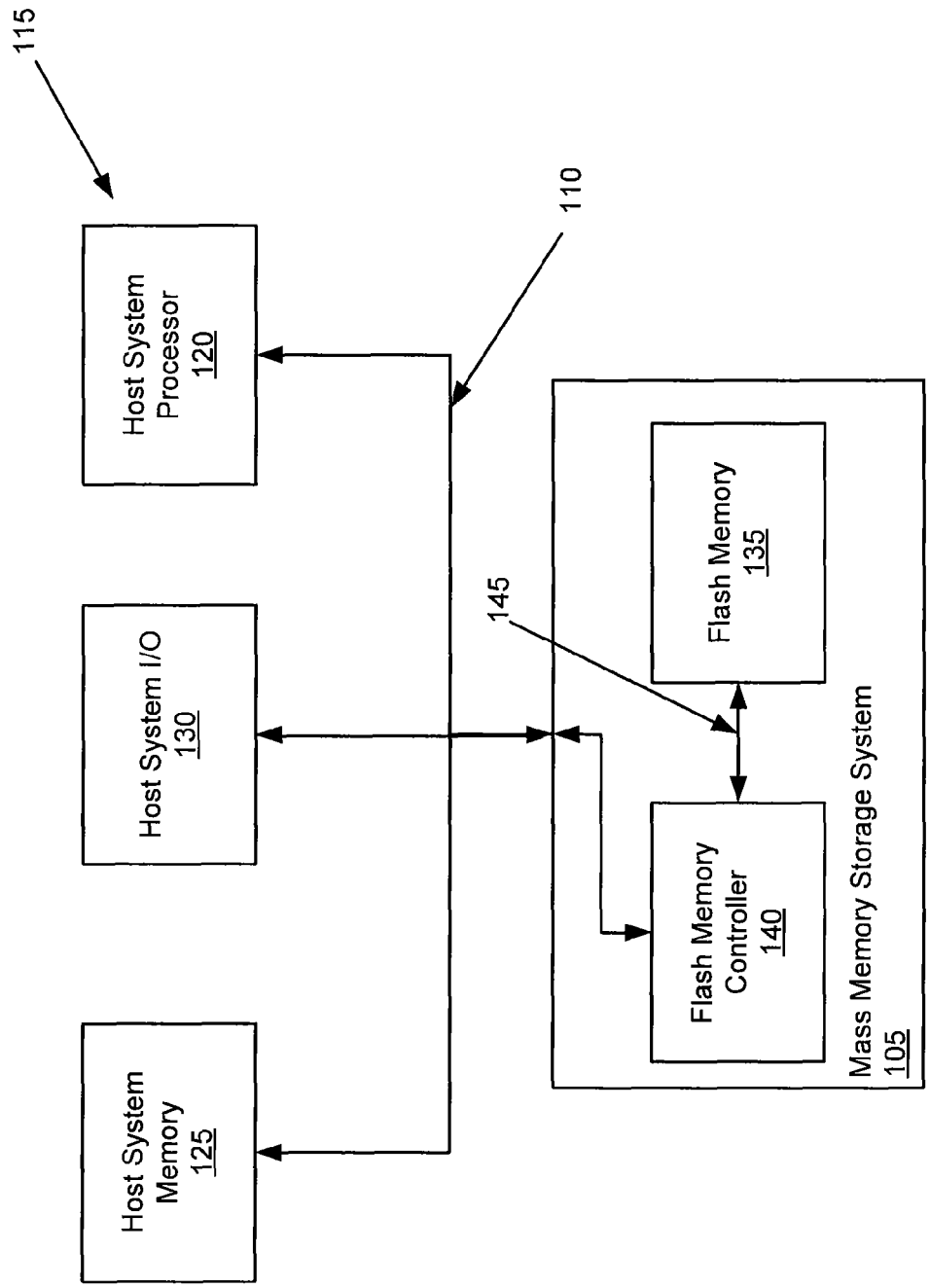
FIG. 1 is a block diagram of a memory system.

A mass memory storage system 105 is shown in FIG. 1. Memory system 105 may be connected to a system bus 110 of a host system, shown generally at 115. The host system 115 may include one or more processors 120, volatile memory 125 and an input/output interface 130 providing connection with input/output devices or circuits. The host system 115 may be a personal computer, a camera, or any other system that uses a mass storage memory system. Memory system 105 may include flash memory circuitry 135 that may include an array of flash memory storage cells, decoders and control circuits. Memory system 105 may also include a controller 140 connected to flash memory circuitry 135 over a bus 145. The bus 145 may include an address bus, a control status bus, serial write data lines and serial read data lines. The memory array flash memory circuitry 135 and flash memory controller 140, as well as other portions of the memory system 105, may be implemented on a single monolithic integrated circuit chip. Alternatively, two or more integrated circuit chips, or die, may be used to form the flash memory circuitry 135 and/or the memory controller 140. Additional flash memory circuitry 135 may be included on separate integrated circuit chips, or die, under the control of the same memory controller 140, or under the control of different memory controllers.

The memory system 105 may be fixed into the host system 115. Additionally, or in the alternative, the memory system 105 may be implemented as a removal card that may be connected to the host system 115 through, for example, the host system input output interface 130.

Figure 2:
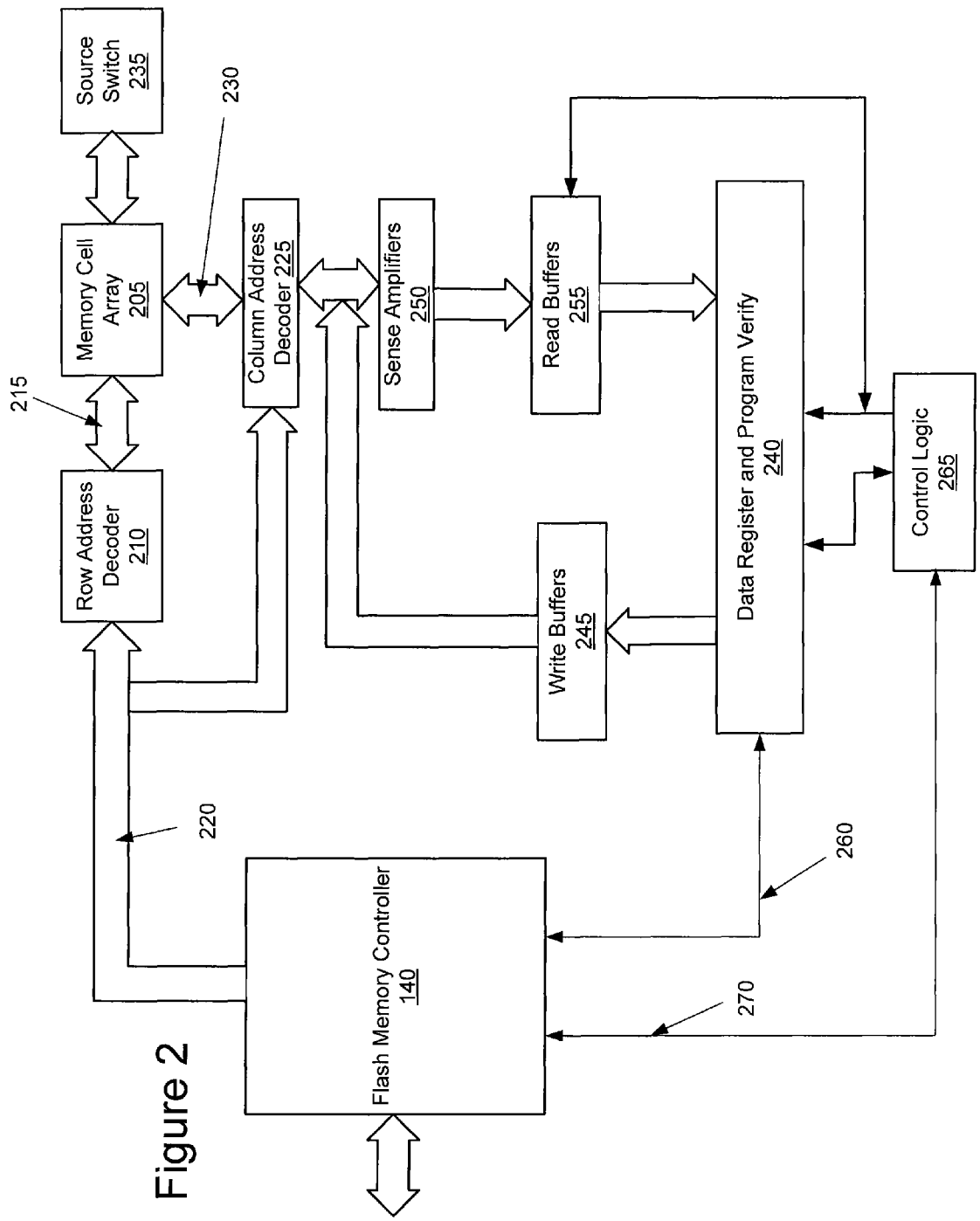
FIG. 2 is a block diagram of one example of a mass memory storage system that may be used in the memory system of FIG. 1.

FIG. 2 shows one example of the mass memory storage system 105 of FIG. 1. In FIG. 2, an array of memory cells 205 is organized into rows and columns The array of memory cells 205 comprises a plurality of floating gate transistors that each include a control gate, at least one floating gate, a source, and a drain. A row address decoder 210 selects one or more row (word) lines 215 that are designated by at least a portion of an address on a memory system address bus 220. A column address decoder 225 selects one or more column (bit) lines 230 as designated by another portion of the address on the address bus 220. A source switch 235 is connected to the source lines of memory cells in array 205. The row lines 215 are connected to the control gates of a row of memory cells and the column lines 230 are connected to source/drain diffusions.

During a read operation, the selected row and column lines are energized to specific sets of voltages for the memory cells that are addressed. These voltages are applied through the row and column address decoders 210 and 225 and may be controlled by the flash memory controller 140. The currents through the addressed memory cells are provided to sense amplifiers 250, and the data bits read from the addressed cell(s) are provided to buffers where they are read by the data register 240. Data register 240 provides read and write data from/to flash memory controller 140 over one or more lines 260.

During programming, the voltages of the selected column lines are set based on incoming data that is received by data register 240, which is temporarily stored in write buffers 245. The program read and erase operations are controlled by control logic 265 in response to signals on a control/status bus 270. The control logic 265 may also receive one or more signals from the data register 240 that indicate when it has been verified that all bits of a chunk of data have been successfully programmed.

An array of memory cells is shown at 205. The array is constructed as a grid of wordlines (e.g., horizontal wordlines) and bitlines (e.g., vertical bitlines). Although the terms "horizontal" and "vertical" are used herein, these terms are relative and merely describe an exemplary grid forming an array of memory cells.

In operation, each vertical bitline connects the source of one cell to the drain of its vertically adjacent cell. Each horizontal wordline connects the control gates of all cells that are to be concurrently accessed during, for example, a read operation or the like. As such, each wordline connects the control gate of a cell to the control gates of its left and right adjacent cells. The array may be divided into blocks, which are used as the basic units for erasure. Each block may contain, for example, 64 pages, each page corresponding to one wordline. A page is usually the basic unit used for programming and reading. A page/wordline may contain, for example, 64K cells for storing information and some additional cells for storing overhead (e.g. parity bits of an error correction code).

The amount of charge on the floating gate of a memory cell controls the conduction through the memory cell. To read the data bit values of a memory cell, a voltage is applied across its source and drain while a voltage is applied to its control gate at a fixed voltage. Data stored in the cell is ascertained based on the voltage applied to the cell's control gate at which the cell starts to conduct current.

Figure 3A:
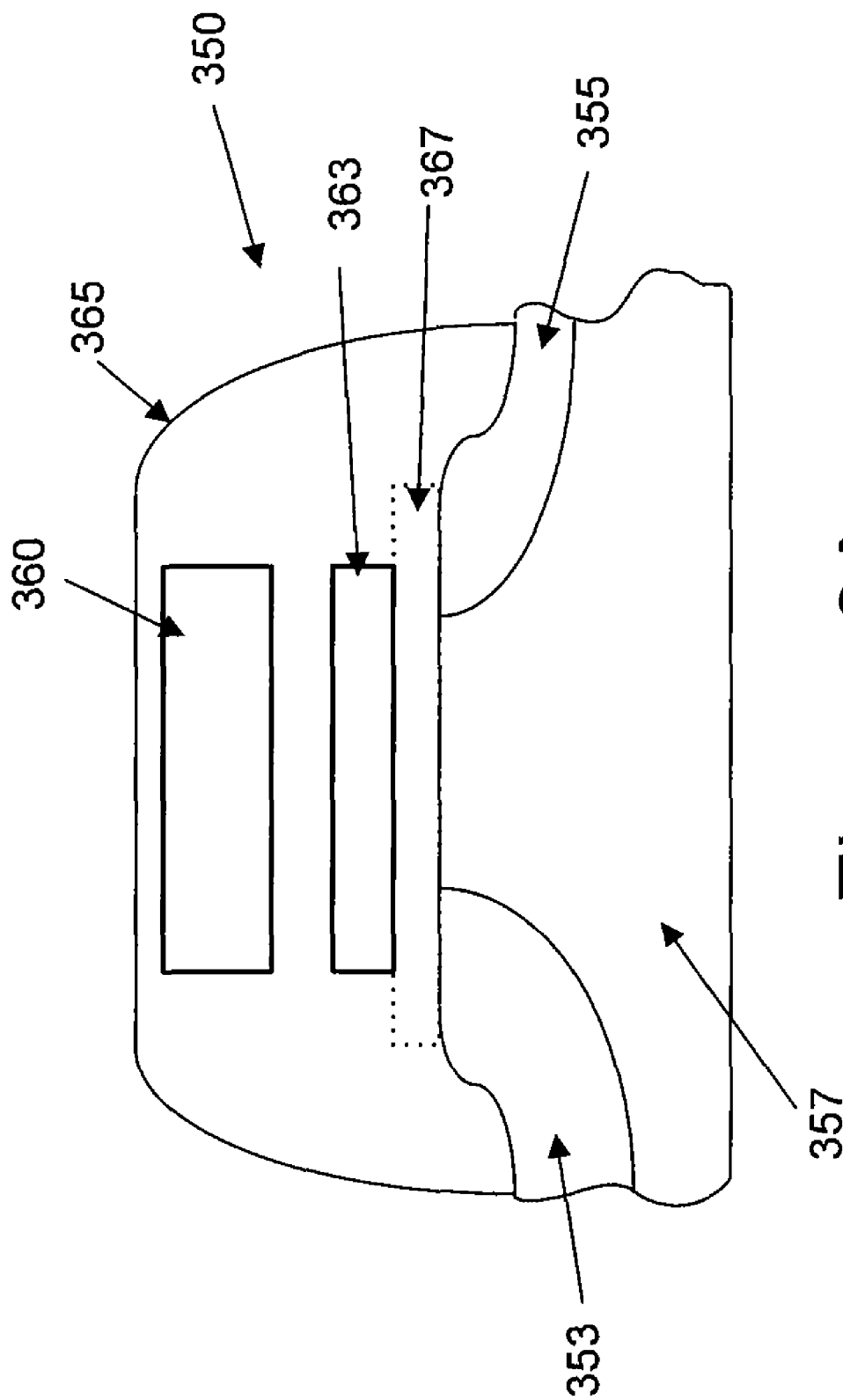
FIG. 3A is a cross-sectional view of a single floating gate memory cell.

FIG. 3A is an example of a single bit memory cell 350. Memory cell 350 includes a source 353 and drain 355 formed in a doped substrate 357, such as a p-type substrate. A control gate 360 and floating gate 363 being encapsulated within an interpoly oxide 365. The floating gate 363 is separated from the source 353, drain 355, and substrate 357 by a tunnel oxide 367.

In a programming operation, voltages under the control of flash memory controller 140 are applied to the memory cell 350 so that a charge is either placed on or removed from floating gate 363 through the tunnel oxide 367. During a read operation, a voltage is applied across the source 353 and drain 355 while a further voltage is applied to the floating gate 363. When the floating gate 363 reaches a threshold voltage, current flows between the source 353 and drain 355. The voltage at which current flows is dependent on the charge on floating gate 363. The charge on floating gate 363, in turn, corresponds to the logical data bits stored in the memory cell number 350. This structure also may be used for multi-bit cells, where a number of distinct charge levels are used to store discrete bits in the cell structure.

Figure 3B:
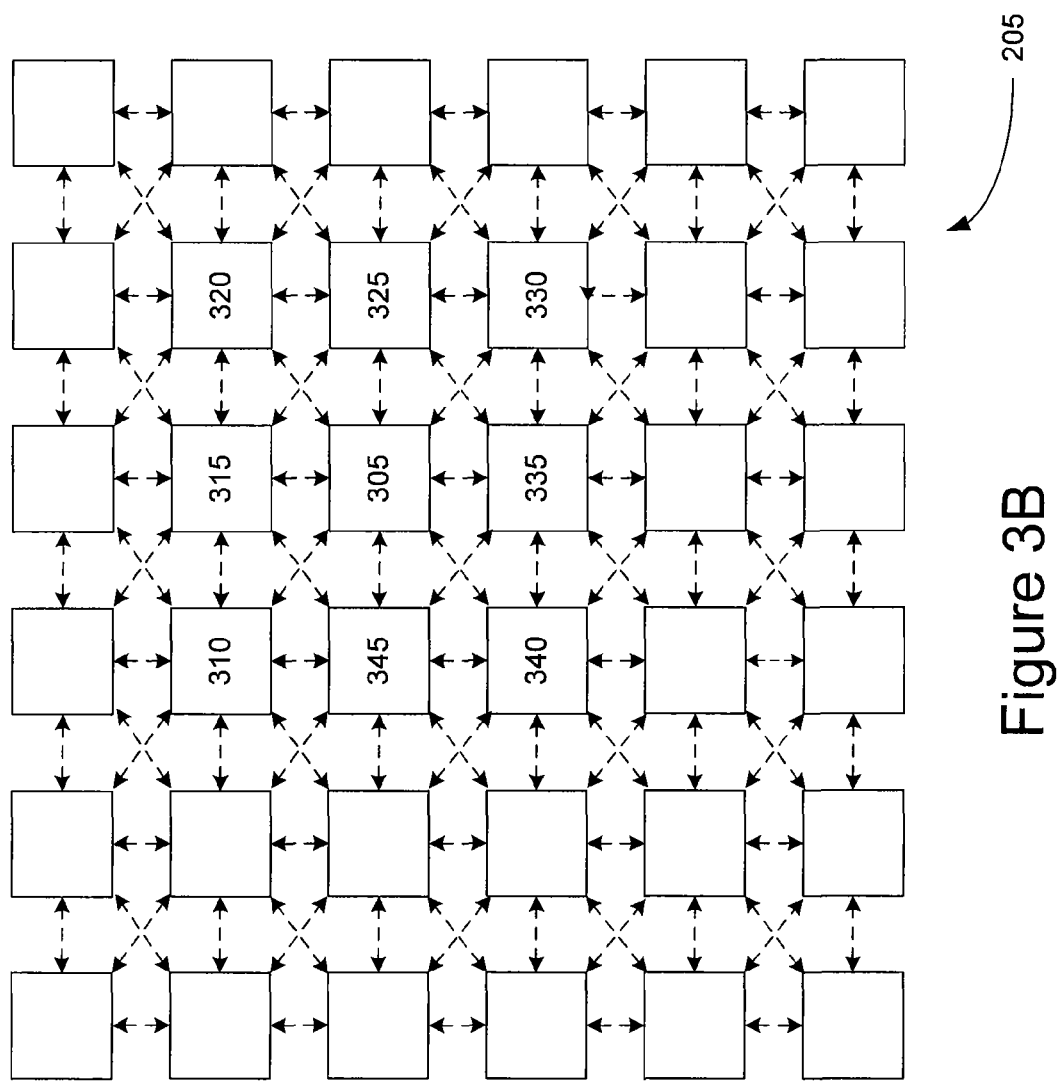
FIG. 3B is a block diagram of a plurality of floating gate memory cells of a memory cell array.

FIG. 3B shows a plurality of floating gate memory cells of memory cell array 205. Memory cells that are adjacent one another in the array 205 are in electric field communication with one another. As such, the memory cells are cross-coupled with one another as shown by the broken arrows between the memory cells. For example, memory cell 305 of FIG. 3B may be cross-coupled with adjacent memory cells 310 through 345. Although the cross-coupling compensation is discussed with respect to reading of data from memory cell 305, the cross-coupling compensation may be used for reading each memory cell of array 205.

The cross-coupling coefficient determines the induced voltage shift on the read voltage of the addressed cell as a function of the change in the threshold voltage of the adjacent cell after the addressed cell has finished its programming operation. Consequently, in order to measure the actual cross-coupling coefficient between an addressed cell and an adjacent cell, the voltage threshold of the adjacent cell may be changed and the resulting change of the threshold voltage of the addressed cell may be measured. This approach, however, may not be suitable for an on-line estimation of the cross-coupling coefficient, as changing the voltage threshold of the adjacent cell corrupts the information stored in the adjacent cell (as this information is represented by the cell's voltage threshold).

Figure 4:
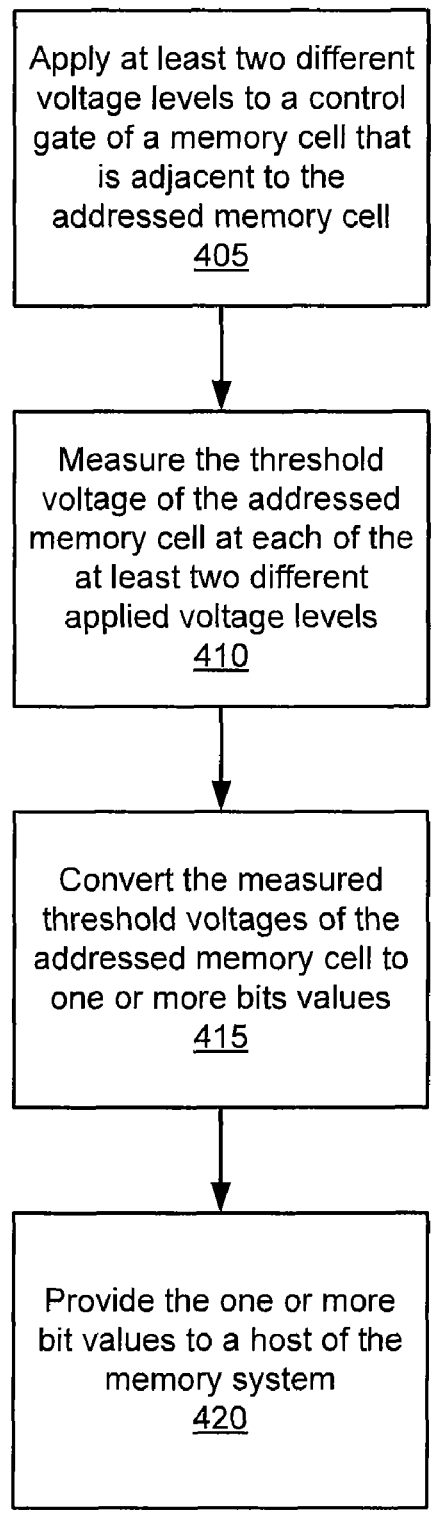
FIG. 4 shows operations that may be used to extract bit values from an addressed memory cell of the array shown in FIG. 3.

The methods and apparatus disclosed herein apply on-line estimation of the cross-coupling coefficient of an addressed cell and its adjacent cell. The on-line estimation is based on the observation that the cross-coupling coefficient between the floating gate of the adjacent cell and the floating gate of the addressed cell is highly correlated with the cross-coupling coefficient between the control gate of the adjacent cell and the floating gate of the addressed cell. This is due to the close proximity of the control and floating gates of a cell. Based on this observation, an estimate of the control gate-to-floating gate cross-coupling coefficient can serve as an estimate for the floating gate-to-floating gate cross coupling coefficient. An estimate of the cross-coupling coefficient may be obtained in a non-destructive manner, which does not corrupt the information stored in the adjacent cell. This estimate is based on changing the voltage applied to the control gate of the adjacent cell without affecting the charge stored in its floating gate (i.e. without changing its threshold voltage). One embodiment is shown in FIG. 4 in connection with FIG. 3B.

With reference to FIG. 3B, memory cell 305 of memory cell array 205 is to be addressed using the circuitry shown in FIG. 2. At 405 of FIG. 4, the controller 140 is used to control decoders 210 and 225 to apply at least two different voltage levels to a control gate of a memory cell that is adjacent to the addressed memory cell. The threshold voltage of the addressed memory cell is measured at the two different applied voltages at 410. At 415, at least two of the measured threshold voltages are converted to one or more bit values corresponding to the data stored in the addressed memory cell. In one embodiment, the controller 140 is positioned outside the memory die on which the addressed memory cell resides, and converts the at least two of the measured thresholds to one or more bit values outside the memory die. The bit values are provided to a host of the memory system at 420. The bit values may be provided to a buffer that is accessible to the host system and/or directly transmitted along a data bus for immediate use by the host system. The process can be repeated again to verify the estimation and/or to achieve a better estimation of the actual threshold voltage of the addressed memory cell, or at others times, as needed. In one embodiment, all of the at least two measured threshold voltages are used to generate together just one set of bit values.

In FIG. 3B, the memory cells adjacent to and in electrical field communication with addressed memory cell 305 include memory cells 310 through 345. The operations shown at 405 and 410 of FIG. 4 may be applied in connection with each memory cell 310 through 345. Alternatively, one or more of the memory cells 310 through 345 may be selected for application of the operations shown at 405 and 410. For example, one or more adjacent memory cells known to have the most significant cross-coupling effect on the addressed memory cell 305 may be selected for application of the operations. To this end, selection may be based on cross-coupling measurements taken during manufacture of the memory storage system 135. Additionally, or alternatively, selection may be based on known cross-coupling effects common to a particular architecture of the flash memory 135.

Other selection criteria may also be employed. One set of operations for estimating the cross-coupling coefficient between an addressed memory cell and a neighboring memory cell which is located in an adjacent wordline to the wordline of the addressed memory cell is shown in FIG. 4. Assuming the addressed memory cell is cell 305, then the operations can be used for estimating the cross coupling coefficient with memory cells 310,315 or 320. However, it does not necessarily applicable to estimation of the cross-coupling coefficient with cells 325 or 345, which are located on the same wordline as the addressed memory cell. This is because voltages in existing memory array structures cannot be applied independently on the control gate of adjacent cell 345 and on the control gate of addressed cell 305, as the control gates of these two cells are connected through a common wordline.

The operation shown at 410 may be implemented in a number of different ways. For example, the voltage on the control gate of the addressed memory cell may be incremented in small steps or continuously ramped with a given voltage across its source and drain. As the voltage on the control gate is altered in this manner, the current flowing through the addressed memory cell is sensed. The voltage on the control gate of the addressed memory cell when the current through the addressed memory cell reaches a predetermined level constitutes a threshold voltage for the addressed memory cell at the voltage level applied to the adjacent memory cell.

The read process may be a real-time process, where the addressed memory cell and one or more of the adjacent memory cells contain user data. Accordingly, it may be desirable to prevent alteration to the data stored in the adjacent memory cells as the addressed memory cell is read. In such instances, during the read process, the voltage levels applied to the adjacent cells are applied to the control gate and not to the floating gate of the adjacent memory cell, and the voltage levels may be limited to a range that does not disturb the data stored in the adjacent memory cell.

Specific cross-coupling coefficients between memory cell pairs may be calculated on-line or off-line. In an on-line process, cross-coupling coefficients between memory cell pairs are calculated by the flash memory controller 140 substantially each time a memory cell is addressed. In an off-line process, cross-coupling coefficients may be calculated by the flash memory controller 140 less frequently or a single time. In either instance, the cross-coupling coefficients may be stored locally (on a temporary or permanent basis) in memory system 105 by the flash memory controller 140. The coefficients may be compressed before they are stored.

For reasons of simplicity, the model used to explain the present method only considers the effect of one adjacent cell on a target cell. However this model may be extrapolated to multiple adjacent cells.

Assume that a target cell is programmed to an initial threshold voltage of $v_t$ while its adjacent cells are in an erased state. Following the programming of the target memory cell, the adjacent memory cell is programmed to a threshold voltage of $v_n$, where the adjacent memory cell is in electric coupling with the target cell. When reading the target cell after the adjacent cell has been programmed to $v_n$, the new reading of the threshold of the target cell will be $v_{t\backslash n}$. The voltage shift due to in is $v_n$ is $v_{t\backslash n}-v_t$ and is denoted by S. Assuming linear modeling of the cross coupling, the shift is given by $S=\alpha \cdot v_n$ and $v_t = v_{t\backslash n} - S = v_{t\backslash n} - \alpha \cdot v_n$, where $\alpha$ is the cross-coupling coefficient between the specific addressed cell and its adjacent cell. Prior art methods for cross-coupling compensation use the average cross-coupling coefficient in order to correct for the voltage shift, where the average may be taken over all the pairs of addressed and adjacent cell having the same relative position within the array. Hence, according to the prior art, an estimation of $v_t$ and S, given $v_{t\backslash n}$ and $v_n$, may be computed as:

$$\hat{v}_t = v_{t\backslash n} - \hat{S}$$

$$\hat{S} = \overline{\alpha} \cdot v_n \qquad (1)$$

where $\overline{\alpha}$ is the average cross-coupling coefficient from a single adjacent cell.

Hence, under the linear cross-coupling model, the error in the estimation of voltage shift S, may be determined as:

$$\Delta S = S - \hat{S} = \hat{v}_t - v_t = \Delta \alpha \cdot v_n, \qquad (2)$$

where $\Delta\alpha$ is the residual cross-coupling coefficient, corresponding to the difference between the actual cross-coupling coefficient $\alpha$ and the average cross-coupling coefficient $\overline{\alpha}$ (i.e., the actual cross-coupling coefficient for the specific addressed memory cell and adjacent memory cell pair is $\alpha = \overline{\alpha} + \Delta\alpha$). If the values for, $v_{t\backslash n}$, $v_n$ and $\alpha = \overline{\alpha} + \Delta\alpha$, are known, a better estimate of $v_t$ may be obtained by correcting the read value $v_{t\backslash n}$ according to the actual cross coupling coefficient between the addressed cell and the adjacent cell (as opposed to using the average cross-coupling coefficient, as in Eq. (1), which may be less accurate). This estimate may be obtained as follows:

$$\hat{v}_t = v_{t\backslash n} - \alpha \cdot v_n = v_{t\backslash n} - (\hat{\alpha} + \Delta\alpha) \cdot v_n \qquad (3)$$

The improved $v_t$ estimate requires knowledge of the cross-coupling coefficient $\alpha$ per cell and this may be problematic. Offline estimation (e.g. during manufacturing) will require storage of the cross-coupling coefficients per cell, which may not be practical. Online estimation (e.g. via $$\hat{\alpha} = \frac{v_{t\backslash n} - v_t}{v_n})$$

will require reading the addressed cell twice—first with the adjacent cell erased (i.e. read $v_t$) and second with the adjacent cell programmed (i.e. read $v_{t\backslash n}$) and this cannot be done as the adjacent cell stores data and hence its threshold voltage cannot be changed for sake of measuring the cross coupling coefficient as it will be destructive to its stored data. The methods described herein overcome these problems by allowing non-destructive online estimation of the cross-coupling coefficients per cell. Using the operations shown in FIG. 4, the specific cross-coupling coefficient for an addressed and adjacent memory cell pair may be determined by applying two voltages $v_{cg1}$, $v_{cg2}$ to the control gate of the adjacent memory cell, and reading the corresponding threshold voltages $v_{t\backslash n,cg1}$, $v_{t\backslash n,cg2}$ of the addressed memory cell given the two different voltages applied to the control gate of the adjacent cell. The voltage $v_{t\backslash n,cg}$ denotes the threshold voltage of the addressed cell given that the adjacent cell is programmed to threshold voltage $v_v$ and given that a voltage $v_{cg}$ is applied to the control gate of the adjacent cell. Based on these readings an estimate of the control gate-to-floating gate cross-coupling coefficient may be calculated and can serve as an estimate of the floating gate-to-floating gate cross-coupling coefficient $\alpha$. Assuming the control gate-to-floating gate cross-coupling coefficient is roughly equal to the floating gate-to-floating gate cross-coupling coefficient $\alpha$, then this may be done using the following equation, which measures the change in the threshold voltage of the addressed cell as a function of the change in the voltage applied to the control gate of the adjacent cell:

$$\alpha = \frac{v_{t\backslash n,cg1} - v_{t\backslash n,cg2}}{v_{cg1} - v_{cg2}} \qquad (4)$$

Hence, the specific cross-coupling coefficient, $\alpha$ of an addressed memory cell may be estimated by calculating the change in the threshold voltage of the addressed cell as a function of the change in the voltage applied to the control gate of the adjacent cell. This may be done by applying two different voltages to the control gate of the adjacent memory cell and reading the threshold voltage of the addressed memory cell at each of the two conditions. If the average cross-coupling coefficient $\overline{\alpha}$ is known, then the residual cross-coupling coefficient $\Delta\alpha$ may be computed as:

$$\Delta\alpha = \alpha - \overline{\alpha} = \frac{v_{t\backslash n,cg1} - v_{t\backslash n,cg2}}{v_{cg1} - v_{cg2}} - \overline{\alpha} \qquad (5)$$

Using the foregoing values, $v_t$ may be estimated as $\hat{v}_t = v_{t\backslash n} - \alpha \cdot v_n = v_{t\backslash n} - (\overline{\alpha} + \Delta\alpha) \cdot v_n$, where $v_{t\backslash n}$ is the read threshold voltage of the addressed cell (under normal conditions), and $v_n$ is the read threshold voltage of the adjacent cell (under normal conditions). Reading under normal conditions refers to reading of an a cell assuming nominal voltage applied to the control gate of its adjacent cell (e.g. $v_{cg1}$ may be the nominal voltage and then $v_{t\backslash n} = v_{t\backslash n,cg1}$)

In some instances, the average voltage shift $\overline{S}(v_n)$ for each value of the threshold voltage of the adjacent cell $v_n$ may be determined by computing the expectation value (e.g. expectation may be taken over all pairs of addressed and adjacent cells having the same relative location in the array):

$$\overline{S}(v_n) = E(v_{t\backslash n} - v_t | v_n) \qquad (6)$$

If the specific voltage shift for a specific pair of addressed memory cell and adjacent memory cell is known, then a residual voltage shift may be computed as:

$$\Delta S(v_n) = S(v_n) - \overline{S}(v_n) \qquad (7)$$

Hybrid models, where the average voltage shift is computed in the general form of (6) and the residual voltage shift is computed according to a linear model, (or any other parametric model), may be employed. Under these models, the following equations may be used for calculating an estimate for the threshold voltage of the cell given the estimate of the residual cross-coupling coefficient $\Delta\alpha$:

$$\hat{v}_t = v_{t\backslash n} - \overline{S}(v_n) - \Delta\alpha \cdot v_n \qquad (8)$$

Figure 5:
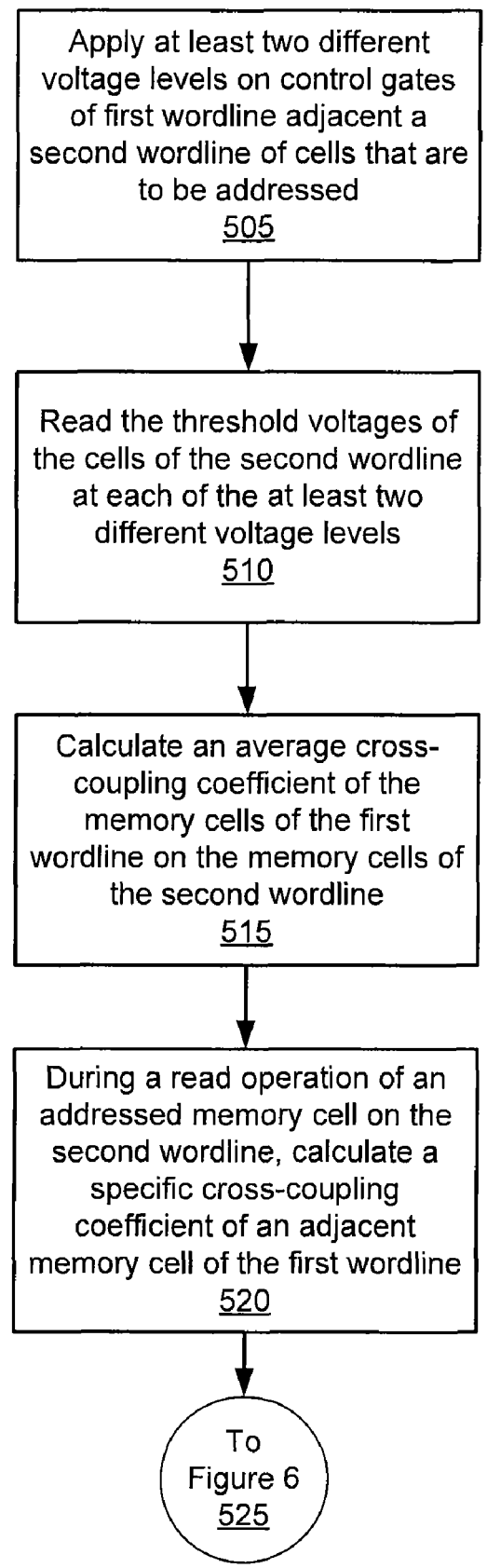
FIG. 5 shows alternative and/or supplemental manners of measuring the threshold of an addressed cell in the presence of cross-coupling effects between the addressed memory cell and one or more adjacent memory cells.
Figure 6:
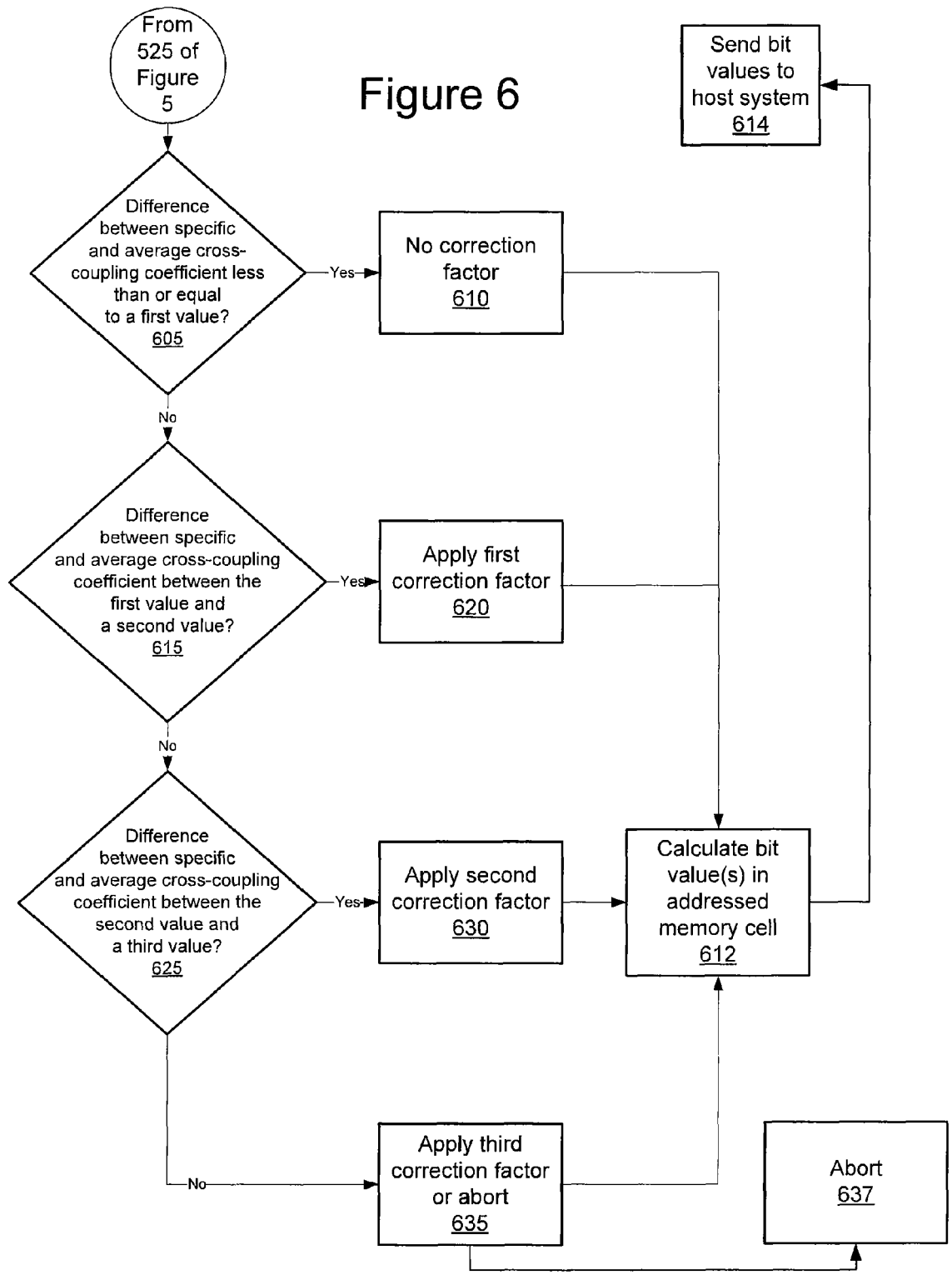
FIG. 6 shows operations comparing a specific cross-coupling coefficient with an average cross-coupling coefficient to calculate bit values in an addressed memory cell.

Alternative and/or supplemental manners for measuring the threshold of an addressed cell in the presence of cross-coupling effects with one or more adjacent memory cells also may be used. One manner is shown in FIGS. 5 and 6. In this implementation, the flash memory controller 140 is used to control various components of the flash memory 135 to apply at least two different voltage levels to the control gates of the memory cells on a first wordline at 505. The memory cells on the first wordline are adjacent to memory cells on a second wordline that are to be addressed. At 510, the threshold voltages of the memory cells on the second wordline are measured at each of at least two different voltage levels. An average cross-coupling coefficient of the memory cells on the first wordline with respect to the memory cells on the second wordline is calculated at 515, where the average cross-coupling coefficient may be computed as a function of the average of the difference between the readings of the second wordline at the two different voltage levels applied to the first wordline. Alternatively, the average cross-coupling coefficient can be computed and stored offline, e.g. based on qualification measurements of the specific flash memory technology, or per flash memory die during production, or per block or per wordline, or per any group of cells. Such offline cross-coupling estimation, as done for the average cross-coupling coefficient may be prohibitive when using an estimate of the specific cross-coupling coefficient per cell due to the high storage requirement needed to store the specific cross-coupling per cell coefficients. Hence for the specific cross-coupling coefficient per cell, an online estimation, although not mandatory, is preferred. When a read operation of an addressed memory cell on the second wordline is executed, a specific cross-coupling coefficient with respect to an adjacent memory cell of the second wordline is calculated at 520, where the specific cross-coupling coefficient may be computed as a function of the difference between the readings of the addressed cell at the two different voltage levels.

One or more operations comparing the specific cross-coupling coefficient with the average cross-coupling coefficient may then be executed by the controller 140 as shown in FIG. 6. At 605, a determination is made whether the magnitude of the difference between the specific and average cross-coupling coefficients is less than or equal to a first value. If this difference is less than or equal to the first value, no correction factor is needed at 610 and the bit values in the addressed memory cell may be calculated at 612 before the bit values are sent to a host system at 614. If it is greater than the first value, a determination is made at 615 whether the difference between the specific and average cross-coupling coefficients is between the first value and a second value. If the magnitude of the difference is between the first and second values, a first computation rule, such as a first correction factor, is applied to the specific cross-coupling coefficient at 620. The corrected cross-coupling coefficient is used by the controller 140 at 612 to calculate the bit values in the addressed memory cell before the bit values are to the host system at 614. If the magnitude of the difference is not between the first and second values, a determination is made at 625 whether the magnitude of the difference between the specific and average cross-coupling coefficients is between the second value and a third value. If it is, a second computation rule, such as a second correction factor is applied to the specific cross-coupling coefficient at 630. The corrected specific cross-coupling coefficient is used at 612 to calculate the bit values in the addressed memory cell before the bit values are sent to the host system at 614.

If the magnitude of the difference between the specific and average cross-coupling coefficients is greater than the third value, a third computation rule such as a third correction factor may be applied to the specific cross-coupling coefficient at 630. The corrected cross-coupling coefficient is used at 612 to calculate the bit values in the addressed memory cell before being sent to the host system at 614. Generally, as the difference between the specific and average voltage difference increases, it indicates that the specific cell has higher cross-coupling with its adjacent cell and hence a larger correction factor should be applied to its read threshold voltage in order to compensate for its read voltage cross-coupling induced shift. Accordingly, the first, second and third computation rules may be, in one embodiment, respectively larger correction factors applied to the specific cross-coupling coefficient. Alternatively, a further comparison may be made to determine whether the difference exceeds a magnitude that indicates a failure to properly calculate either or both the specific and/or average cross-coupling coefficients. A hardware failure may be indicated when the third magnitude is exceeded and an abort operation may be executed at 637. In the event of a failure, actions appropriate to the operation of the mass storage system 105 may be executed. For example, the affected cells may be marked as damaged in the logical addressed table of the system.

Again, the computation of the cross-coupling coefficients may be executed by the controller 140 in an online or off-line calculation process. The resulting calculated cross-coupling coefficients may be stored in the memory system 105 for use during reading of a corresponding addressed memory cell. The cross-coupling coefficients for the memory cell pairs may be calculated in an online or off-line process and stored in the memory 105 for use each time a respective memory cell is addressed. In one embodiment, the average cross-coupling coefficients are computed offline (as they have a small storage requirement due to the small number of coefficients) and the specific per cell cross-coupling coefficients are computed and used online during reading for estimating the threshold voltage of the read cells (thus avoiding the need to store the per cell coefficients). Additionally, or alternatively, the cross-coupling coefficients stored in the memory system 105 may be updated based on selected criterion. For example, an update may occur after a number of reads of a memory cell, after a write operation to an adjacent memory cell, and/or similar operation affecting the cross-coupling coefficients associated with the addressed memory cell. The updated cross-coupling coefficients then may be used to calculate the bit values stored in the corresponding addressed memory cell.

In the above examples, certain models were assumed for describing the cross-coupling effect of adjacent cell's threshold voltage of control gate voltage on the threshold voltage of the addressed cell, e.g. linear models. Assumptions of such models may simplify the implementation of the specific scheme for mitigating the cross-coupling induced disturbance on the addressed cell. However, the described methods can be applied for any model. In the most general setting, the threshold voltage of the addressed cell can be estimated as: $v_t = f(v_{t\backslash n,cg_1}, v_{t\backslash n,cg_2}, \ldots, v_{t\backslash n,cg_i}, v_{cg_1}, v_{cg_2}, \ldots, v_{cg_i})$, where $v_{t\backslash n,cg_1}, v_{t\backslash n,cg_2}, \ldots, v_{t\backslash n,cg_i}$ are the read voltage thresholds of the addressed cell during multiple reading, performed with voltages $v_{cg_1}, v_{cg_2}, \ldots, v_{cg_i}$ applied to the control gate of the adjacent cell, and $f(\bullet)$ is a function which depends on the model governing the cross-coupling induced disturbance of the adjacent cell on the addressed cell. This function may be determined analytically (e.g. based on the flash device physics) or empirically, by a priori measuring the joint statistical distributions of the addressed cell's programmed voltage threshold and the sequence of read voltage thresholds. As the end objective of the reading is to provide an estimation of the stored bits of the cell, the estimation may be more generally described as: $\hat{b} = g(v_{t\backslash n,cg_1}, v_{t\backslash n,cg_2}, \ldots, v_{t\backslash n,cg_i}, v_{cg_1}, v_{cg_2}, \ldots, v_{cg_i})$, where $\hat{b}$ is an estimate of the set of bits which is stored in the addressed cell and $g(\bullet)$ is a function describing the connection between the sequence of read voltage thresholds and the set of bits stored in the addressed cell. E.g. $g(\bullet)$ may be the expected value of the stored bits given the sequence of read voltage thresholds: $g(v_{t\backslash n,cg_1}, v_{t\backslash n,cg_2}, \ldots, v_{t\backslash n,cg_i}, v_{cg_1}, v_{cg_2}, \ldots, v_{cg_i}) = E(\hat{b}|v_{t\backslash n,cg_1}, v_{t\backslash n,cg_2}, \ldots, v_{t\backslash n,cg_i}, v_{cg_1}, v_{cg_2}, \ldots, v_{cg_i})$. The function may be determined analytically (e.g. based on the flash device physics) or empirically, by a priori measuring the joint statistical distributions of the stored bits and the read voltage thresholds.

The foregoing cross-coupling coefficient operations may also be used to obtain bit values from multiple bit per cell (MBC) memory cell structures. MBC structures use multiple threshold values to identify the bit values stored in the memory cell. For example, a first threshold value may correspond to bit values 00. A second threshold value may correspond to bit values 01. A third threshold value may correspond to bit values 10. A fourth threshold value may correspond to bit values 11. If desired, cross-coupling coefficients corresponding to the cross-coupling effect of multiple bit value states of the adjacent memory cell on multiple bit value states of the addressed memory cell may be calculated. When reading an addressed cell with N levels, at least N−1 read voltages may be applied to the addressed cell.

Figure 7:
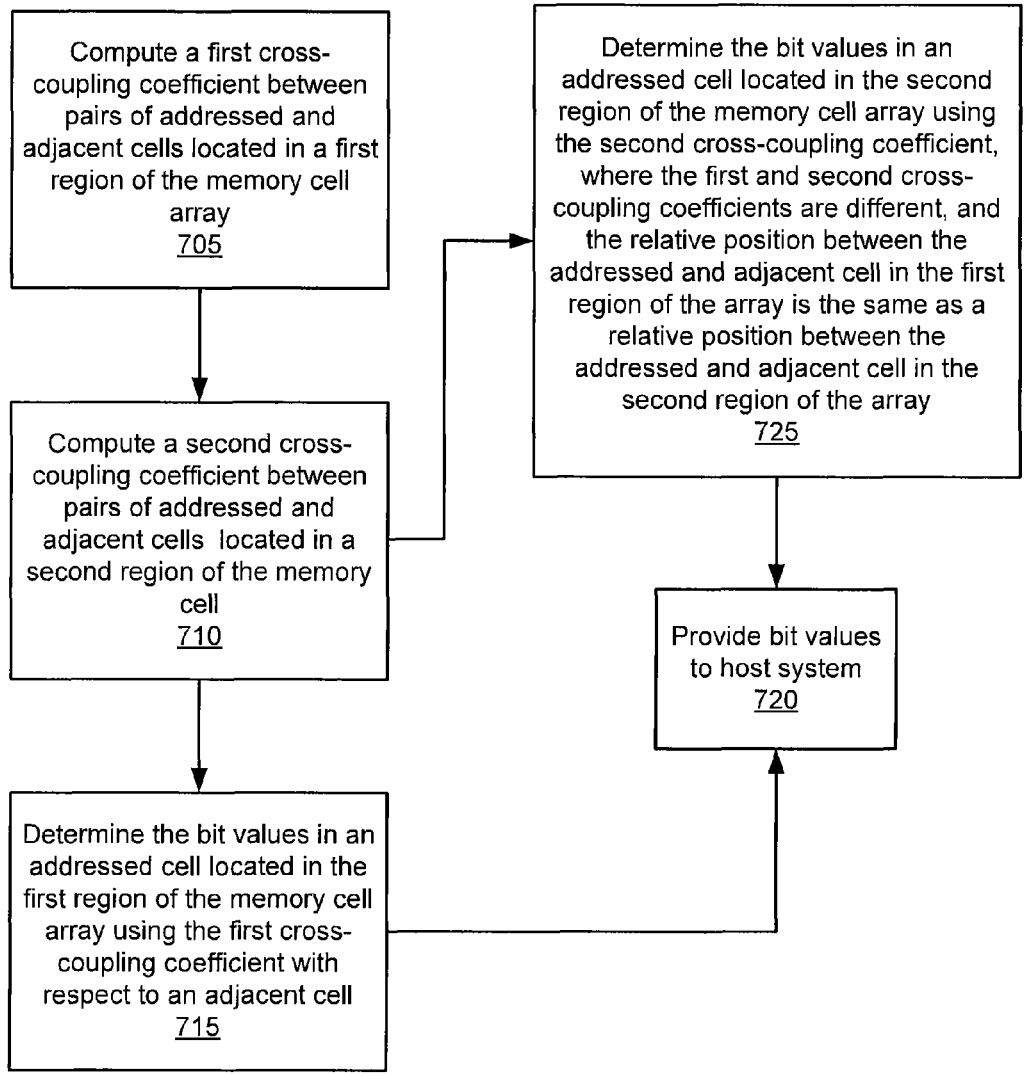
FIG. 7 shows operations that may be used to compensate for the presence of cross-coupling effects while calculating bit values of data stored in addressed memory cells that are at the same relative position in the memory array.
Figure 8:
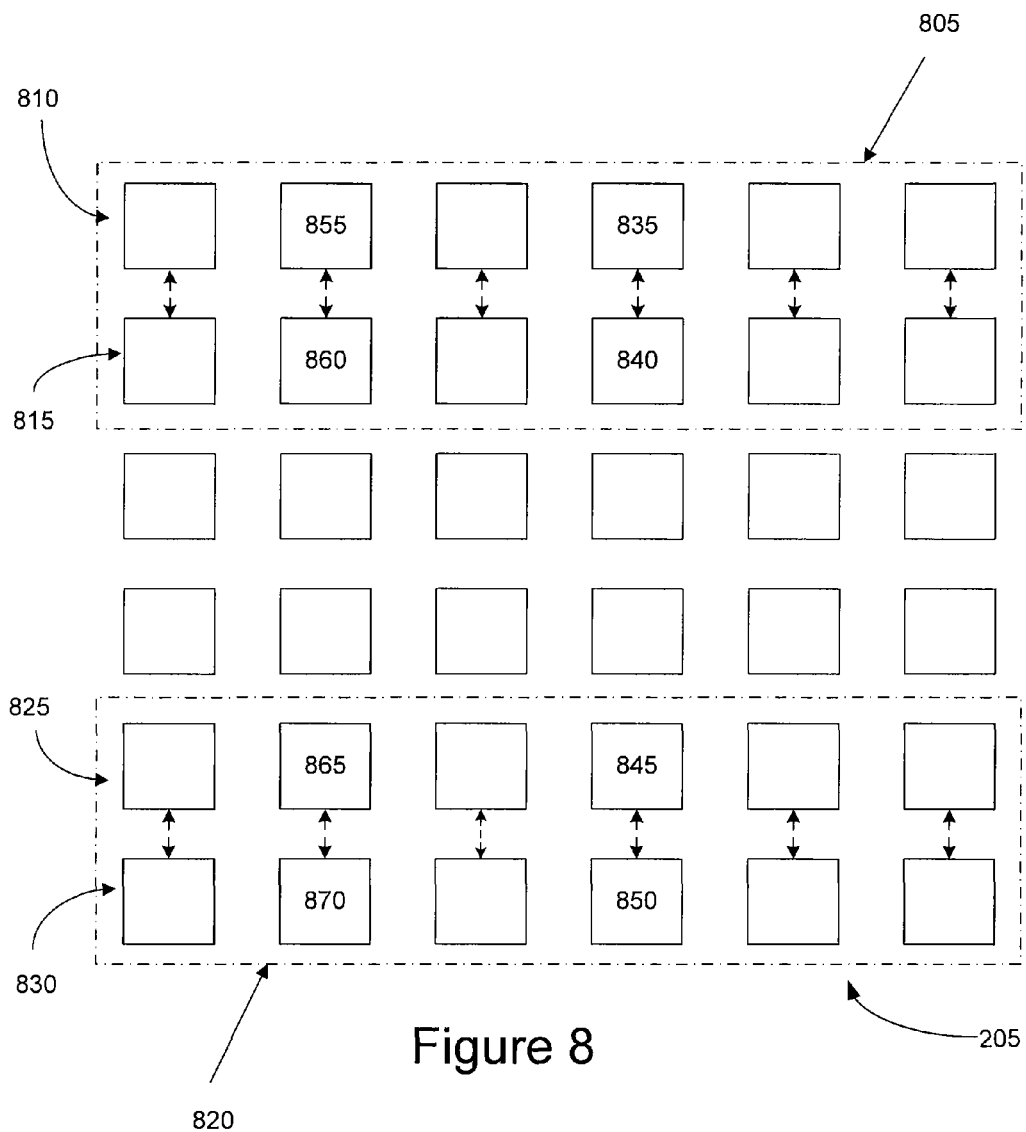
FIG. 8 is a block diagram of a portion of a memory array that has been logically divided into multiple regions to show relative positions between addressed and adjacent memory cells in different regions of the memory array.

Another example in which cross-coupling between an addressed cell and one or more adjacent cells may be handled is shown in connection with FIGS. 7 and 8. With reference to FIG. 8, the array 205 includes a plurality of memory cells.

Memory cells in region 805 may be located on first and second wordlines 810 and 815, respectively. Similarly, memory cells in region 820 may be located on third and fourth wordlines 825 and 830, respectively. Although cross-coupling between the memory cells of region 805 may correspond to the cross-coupling arrows shown in FIG. 3, FIG. 8 only shows the cross-coupling between memory cells that are immediately adjacent one another on separate wordlines 810 and 815. Likewise, only the cross-coupling between memory cells that are immediately adjacent one another on separate wordlines 825 and 830 is shown in FIG. 8.

Various geometrical relationships exist between the memory cells in region 805 and memory cells in region 820 of the array 205. For example, memory cells 835 and 840 of memory region 805 have the same relative position between one another in the memory cell array 205 as memory cells 845 and 850 of memory region 820. Similarly, memory cells 855 and 860 of region 805 have the same relative position within the memory cell array 205 as memory cells 865 and 870. In some cases, the addressed cells may be on the same wordline of the flash memory array, while in other cases the addressed cells may be on different wordlines.

The geometrical relationships of FIG. 8 are put to use in the operations shown in FIG. 7. As shown at 705, a first cross-coupling coefficient between and addressed and adjacent cell pair located in the first region 805 of the memory cell array 205 is calculated. A second cross-coupling coefficient between and addressed and adjacent cell pair located in the second region 820 of the memory cell array 205 is calculated at 710, where the relative position between the addressed and adjacent cell in the first region 805 has the same relative position as the addressed and adjacent cell in the second region 820. The bit values in the addressed cell located in the first region 805 is determined at 715 using the first cross-coupling coefficient with respect to the adjacent cell. The bit values in the addressed cell located in the second region 820 are determined at 725 using the second cross-coupling coefficient, where the second cross-coupling coefficient has a value that is different from the first cross-coupling coefficient.

In another example similar to the one shown in FIGS. 7 and 8, an average cross coupling coefficient may be calculated to compute the disturbance to bit values stored in addressed memory cells from the memory cells which are in a certain geometrical position relative to the addressed memory cells. This average cross coupling coefficient may be used for all regions. A first specific cross-coupling coefficient for the memory cell pairs in region 805 may be calculated as the deviation from the average cross coupling coefficient and used to determine the bit values stored in addressed memory cells of that region. A second, different specific cross-coupling for the memory cell pairs in region 820 may be calculated and used to determine the bit values stored in the addressed memory cells of that region, where regions 805 and 820 have the same relative position in the memory cell array 205. Additionally, different specific cross-coupling coefficients may be calculated for different regions of the memory cell array 205 and used to calculate corresponding bit values for addressed cells in their respective regions. The differing specific cross-coupling coefficients may be compressed to provide a compressed set of coefficient values that may be stored in the memory system 105. In each of the examples described in connection with FIGS. 7 and 8, the process used to calculate the cross-coupling coefficients may be similar to the process described above where at least two different voltages are applied to a control gate of the corresponding adjacent cell while the threshold value of the addressed cell is read at the at least two different voltages. Based on the two threshold voltages that are read and the applied voltage levels, the cross-coupling coefficient of the corresponding addressed cell may be computed. The correction of the threshold voltage of the addressed cell may be computed as a function of $v_{t\backslash n1} - v_{t\backslash n2}$, where $v_{t\backslash n1}$, $v_{t\backslash n2}$ are the two readings of the threshold voltages of the addressed cell under the applied voltages to the adjacent cell.

The operations disclosed in FIGS. 4 through 7 may be performed through manipulation of the various components of flash memory 135 by the flash memory controller 140 using electrical signals provided over bus 145. This manipulation may be based on the execution of code by the flash memory controller 140, where the code is stored in the memory 115. Additionally, or alternatively, the manipulation may be based on a state machine implemented in the flash memory controller 140. Likewise, calculation operations may be executed by the flash memory controller 140 based on logical data and/or analog signals provided over bus 145. As such, each of the operations is executed automatically.

In other embodiments, the measurements used to determine the average cross-coupling coefficient and the specific cross-coupling coefficient for the addressed cell may be made at different times. Also, rather than making actual measurements for determining the average cross-coupling coefficients for the addressed cell, theoretical calculations may be made based on the design parameters for the array and that theoretical reference, or default, value may be the used in place of measure average cross-coupling. In yet other implementations, average cross-coupling coefficient may be determined using measurements on a default or "dummy" addressed cell in a totally different array of cells than the array on which the actual addressed cell resides. Additionally, the calculation of specific coefficients may be omitted altogether and a reference or default voltage difference that represents an average threshold voltage difference for cells in the array, when performing two (or more) read operations under known conditions (e.g. applying two known voltages to the control gate of the adjacent cell), may be used in conjunction with a specific voltage difference that may be measured online, by performing the two (or more) read operations under the known conditions. The reference voltage difference may be determined by actual measurements on the same array as the addressed memory cell, by actual measurements on an array different than that of the addressed memory cell, or through theoretical calculations.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method for reading an addressed memory cell in a memory die of a memory system, the method comprising:
applying at least two different voltage levels to a control gate of a memory cell in an array of memory cells, wherein the memory cell is adjacent to and in electrical field communication with the addressed memory cell;
measuring a threshold voltage of the addressed memory cell at each of the at least two different applied voltage levels;
converting at least two of the measured threshold voltages of the addressed memory cell to one or more bit values, wherein the converting of the at least two measured voltages to bit values is done outside the memory die; and providing the one or more bit values to a host of the memory system.

2. The method of claim 1, wherein the converting of the at least two of the measured threshold voltages comprises:
converting the at least two of the measured threshold voltages of the addressed memory cell to an adjusted threshold voltage of the addressed memory cell; and
converting the adjusted threshold voltage to the one or more bit values.

3. The method of claim 1, wherein the adjacent memory cell has a threshold voltage that remains substantially unchanged during application of the at least two different voltage levels.

4. The method of claim 1, further comprising storing one or more data bits in the adjacent memory cell during application of the at least two different voltage levels.

5. The method of claim 2, wherein the converting at least two of the measured threshold voltages of the addressed memory cell to the adjusted threshold voltage value comprises:
calculating a difference between the measured threshold voltages at two different applied voltage levels;
calculating the adjusted threshold voltage value of the addressed memory cell using the difference.

6. The method of claim 5, further comprising calculating a cross-coupling coefficient, wherein the calculating of the adjusted threshold voltage value of the addressed memory cell also uses the cross-coupling coefficient.

7. The method of claim 1, wherein the converting at least two of the measured threshold voltages of the addressed memory cell to the one or more bit values comprises:
calculating a cross-coupling coefficient for each of a plurality of memory cells of the array of memory cells, wherein the cross-coupling coefficient for a given memory cell corresponds to a difference between threshold voltages of the given memory cell measured at two different voltage levels applied to a memory cell that is adjacent to and in electrical field communication with the given cell;
determining an average cross-coupling coefficient for the plurality of memory cells of the array of memory cells using the measured cross-coupling coefficients of the plurality of memory cells of the array of memory cells;
calculating, for the addressed memory cell, a specific cross-coupling coefficient corresponding to a difference between the threshold voltages measured at two different voltage levels applied to a memory cell that is adjacent to and in electrical field communication with the addressed cell;
comparing the average cross-coupling coefficient and the specific cross-coupling coefficient to determine a correction factor; and
generating the one or more bit values using the correction factor.

8. A method for reading an addressed memory cell in a memory die of a memory system comprising:
determining a reference voltage difference for a plurality of target memory cells of an array of memory cells;
applying at least two different voltage levels to a control gate of an adjacent memory cell that is in electrical field communication with the addressed memory cell;
measuring a threshold voltage of the addressed memory cell at each of the at least two different applied voltage levels;
calculating a specific voltage difference between threshold voltages of the addressed memory cell measured at two of the different voltage levels applied to the adjacent memory cell;
converting at least one of the measured threshold voltages of the addressed memory cell to one or more bit values using the specific voltage difference, wherein the converting depends on a difference between the specific voltage difference and the reference voltage difference; and
providing the one or more bit values to a host system of the memory system.

9. The method of claim 8, wherein the converting at least one of the measured threshold voltages of the addressed memory cell to one or more bit values comprises using a first computation rule when the difference between the specific voltage difference and the reference voltage difference is greater than a first magnitude, but less than a second magnitude, and using a second computation rule different from the first computation rule when the difference between the specific voltage difference and the reference voltage difference is greater than the second magnitude.

10. A method for operating a memory system comprising:
calculating a first cross-coupling coefficient indicative of a cross-coupling effect of a first memory cell on a second memory cell, wherein the first memory cell is adjacent to and in electrical field communication with the second memory cell in an array of memory cells;
measuring a threshold voltage of the second memory cell;
calculating a second cross-coupling coefficient indicative of a cross-coupling effect of a third memory cell on a fourth memory cell, wherein the third memory cell is adjacent to and in electrical field communication with the fourth memory cell in the array of memory cells, wherein the second cross-coupling coefficient is different than the first cross-coupling coefficient;
measuring a threshold voltage of the fourth memory cell;
converting, using the first cross-coupling coefficient, the measured threshold value of the second memory cell to one or more bit values stored in the second memory cell;
converting, using the second cross-coupling coefficient, the measured threshold value of the fourth memory cell to one or more bit values stored in the fourth memory cell;
providing the one or more bit values of the second and fourth memory cells to a host of the memory system;
wherein the first and second memory cells have a relative geometrical position in the array of memory cells that is the same as a relative geometrical position of the third and fourth memory cells in the array of memory cells.

11. The method of claim 10, wherein the second and fourth memory cells are located in the array of memory cells on a same wordline.

12. The method of claim 10, further comprising:
calculating a plurality of specific cross-coupling coefficient values for adjacent memory cells in the array of memory cells;
compressing the plurality of cross-coupling coefficient values to provide a compressed set of coefficient values; and
storing the compressed set of coefficient values in the memory system.

13. The method of claim 10, wherein calculating the first cross-coupling coefficient comprises:
taking a first reading of a threshold voltage of the second memory cell while applying a first voltage level to a control gate of the first memory cell;

taking a second reading of the threshold voltage of the second memory cell while applying a second voltage level to the control gate of the first memory cell; and calculating the first cross-coupling coefficient using at least one of the first and second threshold voltage readings of the second memory cell.

14. The method of claim 13, wherein calculating the first cross-coupling coefficient comprises:

calculating a difference value between the first and second threshold voltage readings of the second memory cell; and calculating the first cross-coupling coefficient using the difference value.

15. The method of claim 13, wherein the first memory cell has a threshold voltage that remains substantially unchanged during application of the first and second voltage levels to the control gate of the first memory cell.

16. A memory system comprising:

an array of memory cells organized into rows and columns, wherein each memory cell includes a control gate;

a wordline decoder adapted to select one or more rows of the array of memory cells;

a column decoder adapted to select one or more columns of the array of memory cells, wherein the wordline decoder and the column decoder energize electrical lines of the array of memory cells for reading selected memory cells;

a sensing circuit in communication with the column decoder to detect current flow through the selected memory cells of the array of memory cells;

a processor in communication with the wordline decoder, the column decoder, and the sensing circuit;

wherein the processor, the wordline decoder, the column decoder, and the sensing circuit cooperate to execute operations comprising applying at least two different voltage levels to a control gate of a memory cell in the array of memory cells, wherein the memory cell is adjacent to and in electrical field communication with an addressed memory cell;

measuring a threshold voltage of the addressed memory cell at each of the at least two different applied voltage levels;

converting at least one of the measured threshold voltages and two of the applied voltage levels to one or more bit values stored in the addressed cell; and providing the one or more bit values to a host of the memory system.

17. The system of claim 16, wherein the adjacent memory cell has a threshold voltage that remains substantially unchanged during application of the at least two different voltage levels.

18. The system of claim 16, wherein the memory cells of the array of memory cells comprise multi-bit per cell memory cells.

19. The system of claim 18, wherein each memory cell of the array of memory cells stores N bits, and wherein the operation of measuring a threshold voltage of the addressed memory cell in the array of memory cells comprises applying at least $2^N-1$ voltage levels to the control gate of the addressed memory cell in the array of memory cells.

20. A memory system comprising:

an array of memory cells organized into rows and columns, wherein each memory cell includes a control gate;

a wordline decoder adapted to select one or more rows of the array of memory cells;

a column decoder adapted to select one or more columns of the array of memory cells, wherein the wordline decoder and the column decoder energize electrical lines of the array of memory cells for reading and programming selected memory cells;

a sensing circuit in communication with the column decoder to detect current flow through the memory cells of the array of memory cells;

a processor in communication with the wordline decoder, the column decoder, and the sensing circuit;

wherein the processor, the wordline decoder, the column decoder, and the sensing circuit are configured to cooperate to execute operations comprising:

calculating a first cross-coupling coefficient indicative of a cross-coupling effect of a first memory cell on a second memory cell, wherein the first memory cell is adjacent to and in electrical field communication with the second memory cell in the array of memory cells;

measuring a threshold voltage of the second memory cell;

converting, using the first cross-coupling coefficient, the measured threshold voltage of the second memory cell to one or more bit values;

calculating a second cross-coupling coefficient indicative of a cross-coupling effect of a third memory cell on a fourth memory cell, wherein the third memory cell is adjacent to and in electrical field communication with the fourth memory cell in the array of memory cells, wherein the second cross-coupling coefficient is different than the first cross-coupling coefficient;

measuring a threshold voltage of the fourth memory cell;

converting, using the second cross-coupling coefficient, the threshold voltage of the fourth memory cell to one or more bit values; and wherein the first and second memory cells have a relative geometrical position in the array of memory cells that is the same as a relative geometrical position of the third and fourth memory cells in the array of memory cells.

21. The system of claim 20, wherein the second and fourth memory cells are located in the array of memory cells on a same wordline.

22. The system of claim 20, wherein the processor, the wordline decoder, the column decoder, and the sensing circuit cooperate to execute further operations comprising:

calculating a plurality of cross-coupling coefficient values for adjacent memory cells in the array of memory cells;

compressing the plurality of cross-coupling coefficient values to provide a compressed set of coefficient values; and storing the compressed set of coefficient values in the memory system.

\* \* \* \* \*